(12) United States Patent
Pribisic et al.

(10) Patent No.: US 9,925,953 B2
(45) Date of Patent: *Mar. 27, 2018

(54) SWIPE AND TAP VERIFICATION FOR ENTRY SYSTEM

(71) Applicant: Magna Closures Inc., Newmarket (CA)

(72) Inventors: Mirko Pribisic, North York (CA); Timothy DeZorzi, South Lyon, MI (US); Kurt M. Schatz, Uxbridge (CA)

(73) Assignee: MAGNA CLOSURES INC., Newmarket (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/358,762

(22) Filed: Nov. 22, 2016

(65) Prior Publication Data

US 2017/0072907 A1    Mar. 16, 2017

Related U.S. Application Data

(63) Continuation of application No. 14/728,052, filed on Jun. 2, 2015, now Pat. No. 9,499,127.

(60) Provisional application No. 62/012,751, filed on Jun. 16, 2014.

(51) Int. Cl.
| | |
|---|---|
| *B60R 25/00* | (2013.01) |
| *B60R 25/20* | (2013.01) |
| *B60R 25/23* | (2013.01) |
| *H03K 17/96* | (2006.01) |
| *E05B 81/56* | (2014.01) |
| *G06F 3/044* | (2006.01) |

(52) U.S. Cl.
CPC .......... *B60R 25/2045* (2013.01); *B60R 25/23* (2013.01); *E05B 81/56* (2013.01); *G06F 3/044* (2013.01); *H03K 17/9622* (2013.01); *H03K 2217/96058* (2013.01); *H03K 2217/960755* (2013.01)

(58) Field of Classification Search
CPC ............... B60R 25/2045; B60R 25/23; H03K 17/9622; E05B 81/56; G06F 3/044
See application file for complete search history.

(56) References Cited

U.S. PATENT DOCUMENTS

| | | | |
|---|---|---|---|
| 6,236,120 B1 | 5/2001 | Loraas et al. | |
| 6,982,626 B2 | 1/2006 | Nedorezov | |
| 7,248,151 B2 | 7/2007 | McCall | |
| 7,255,466 B2 | 8/2007 | Schmidt et al. | |
| 7,637,631 B2 | 12/2009 | McDermott et al. | |
| 7,911,321 B2 | 3/2011 | Bingle et al. | |
| 8,113,695 B2 | 2/2012 | Meinke et al. | |
| 8,400,265 B2 | 3/2013 | Sarioglu et al. | |
| 9,499,127 B2 * | 11/2016 | Pribisic | ............... B60R 25/2045 |
| 2006/0262549 A1 | 11/2006 | Schmidt et al. | |

(Continued)

*Primary Examiner* — Leon Flores
(74) *Attorney, Agent, or Firm* — Dickinson Wright PLLC

(57) ABSTRACT

A system and method for providing access to a vehicle operation includes a first user-input interface, a second user-input interface, and a vehicle controller. The first user-input interface is configured to interact with a user via a swipe-up input. The second user-input interface is configured to interact with the user via an application independent of the swipe-up input. The vehicle controller is configured to control the vehicle operation in response to detecting a first swipe-type user-input via the first user-input interface and a second user-input via the second user-input interface within a predetermined time.

21 Claims, 13 Drawing Sheets

(56) References Cited

U.S. PATENT DOCUMENTS

2010/0085147 A1    4/2010  McCall
2015/0353033 A1   12/2015  Pribisic et al.

* cited by examiner

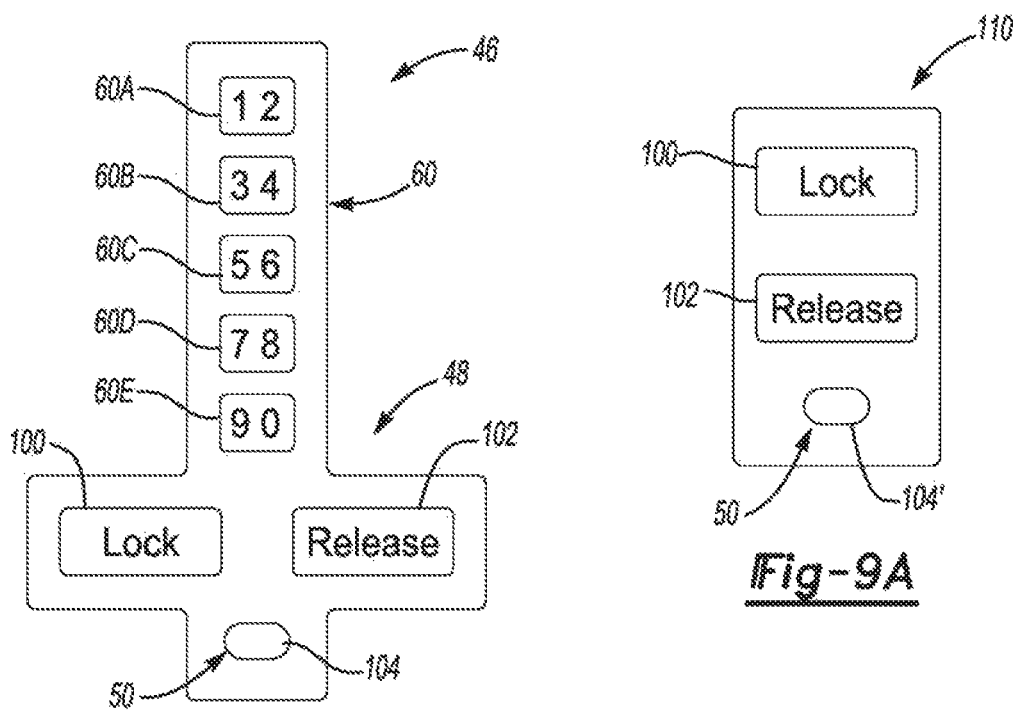
Fig-7
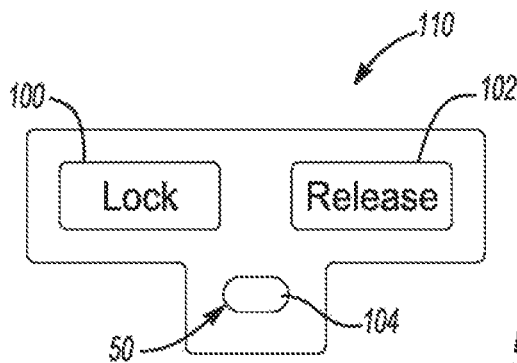
Fig-8
Fig-9A
Fig-9B

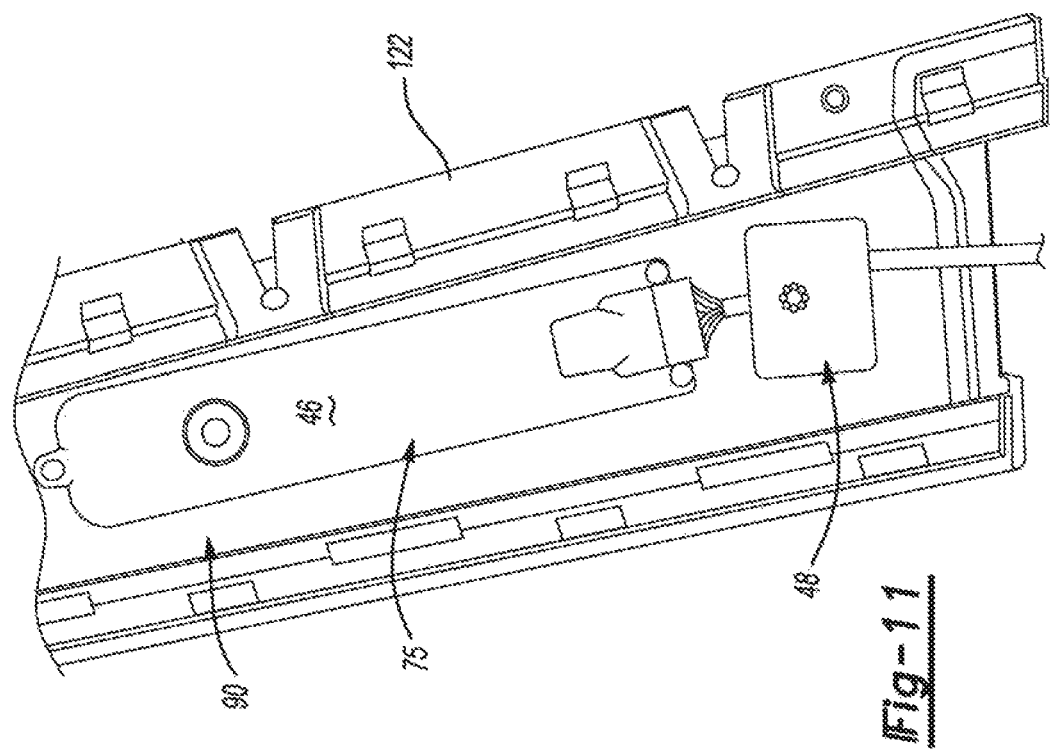
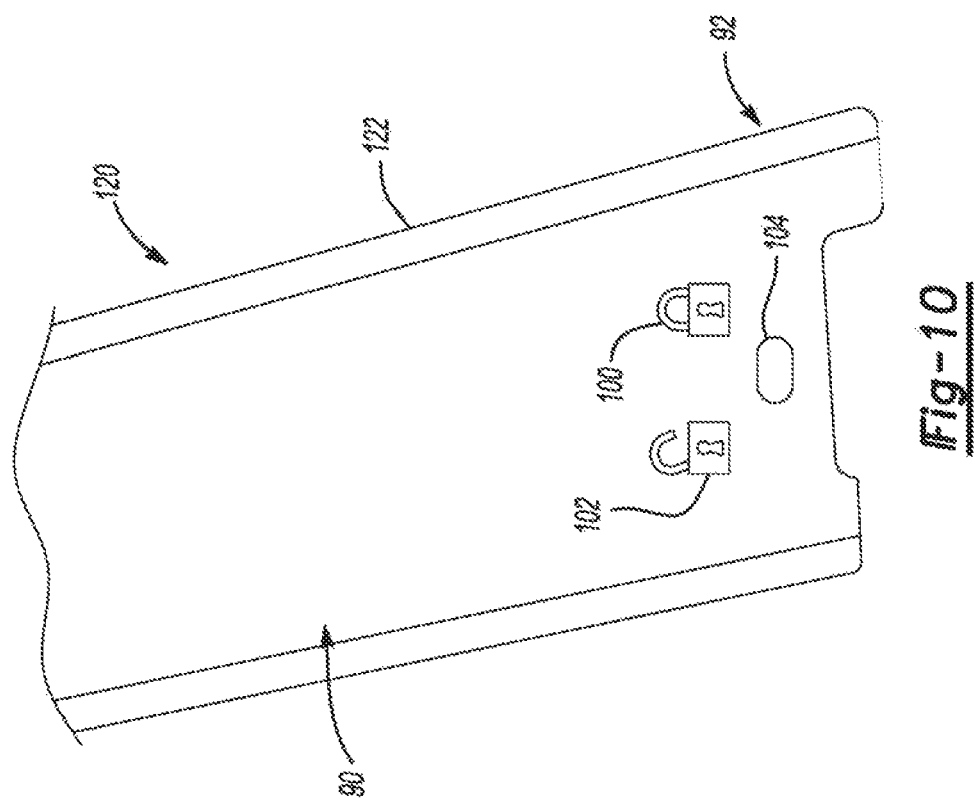

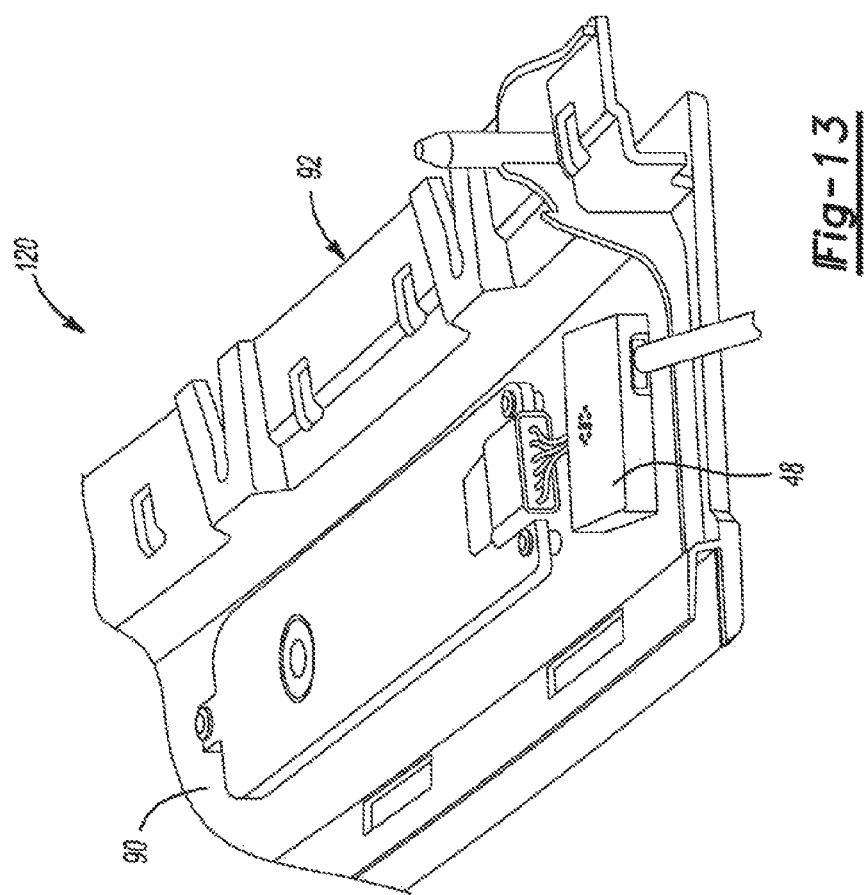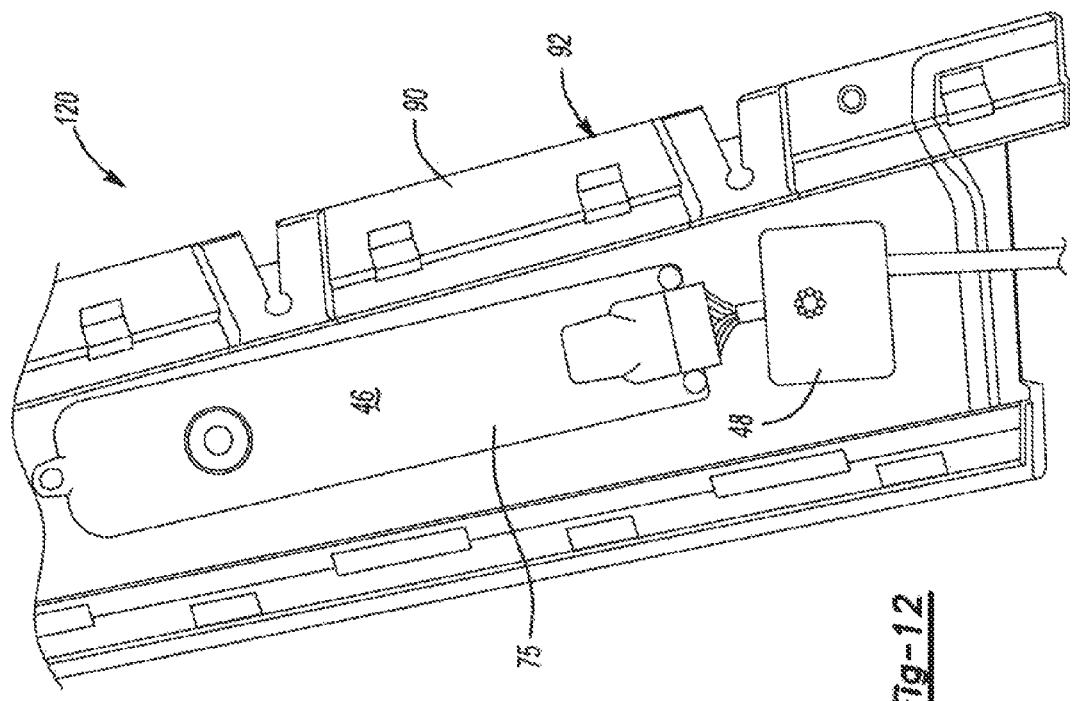

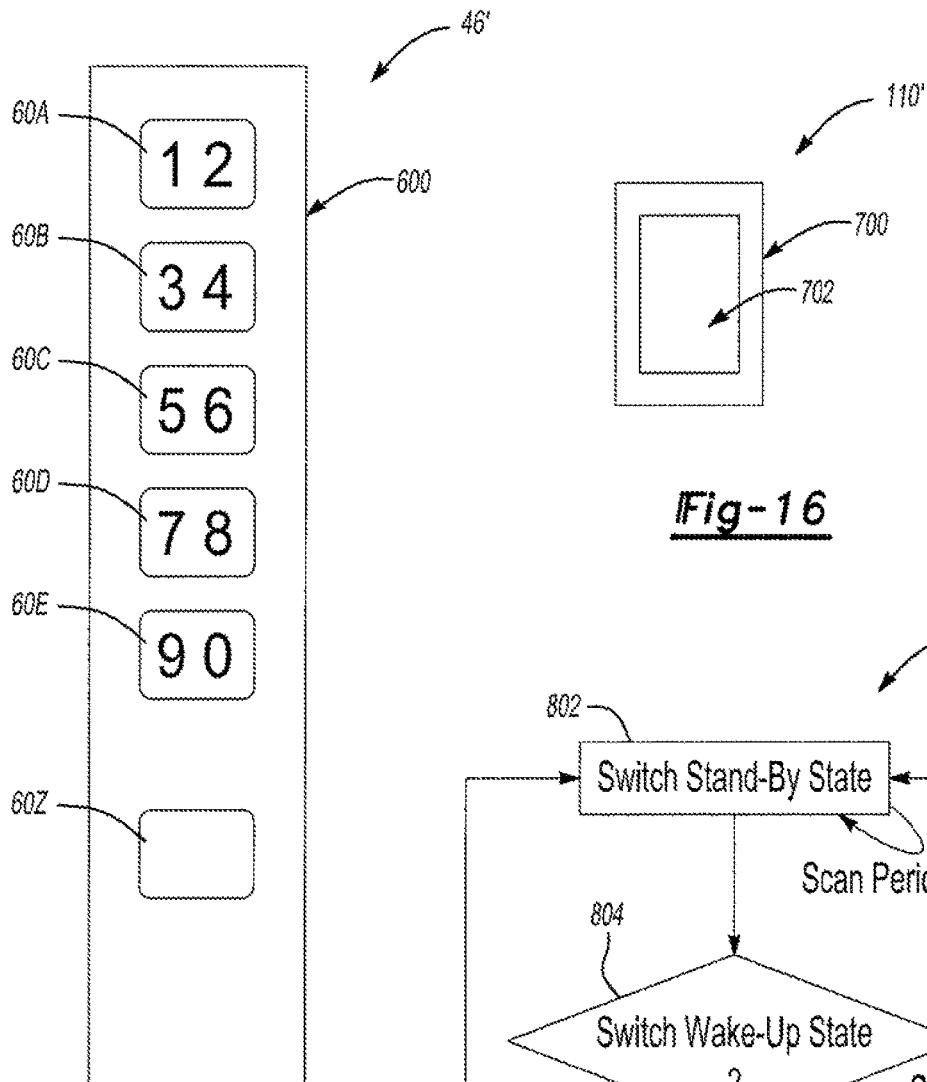
*Fig-15*
*Fig-16*
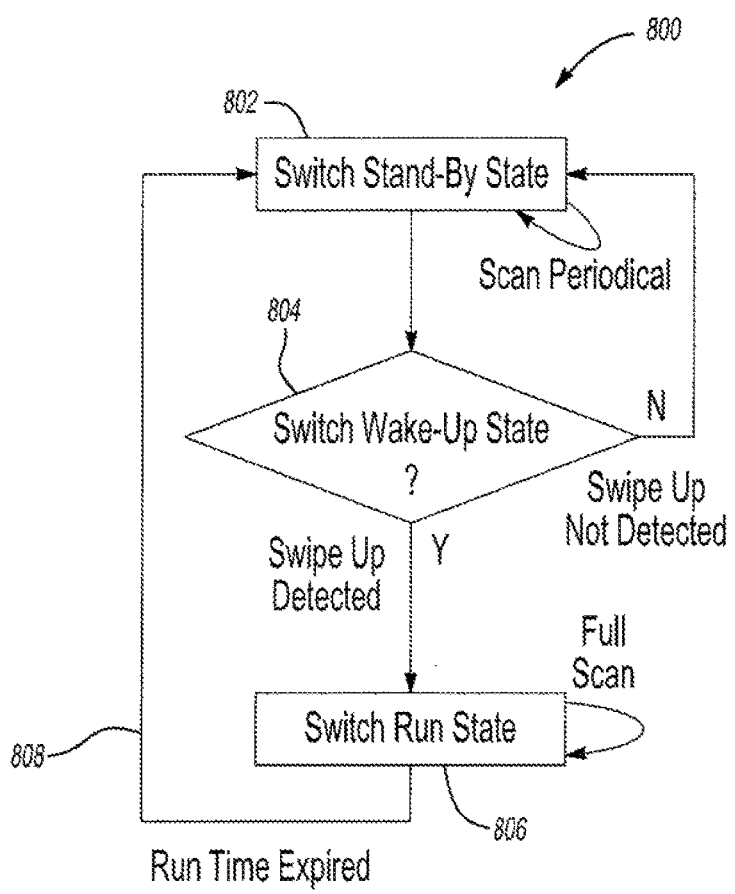
*Fig-17*

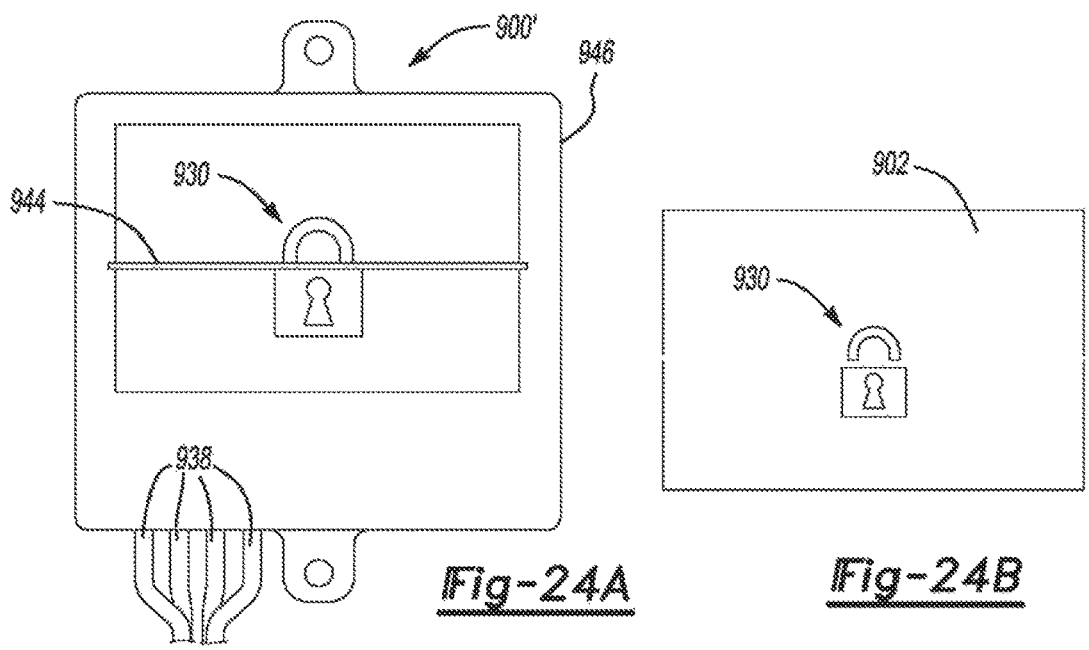
*Fig-24A*   *Fig-24B*
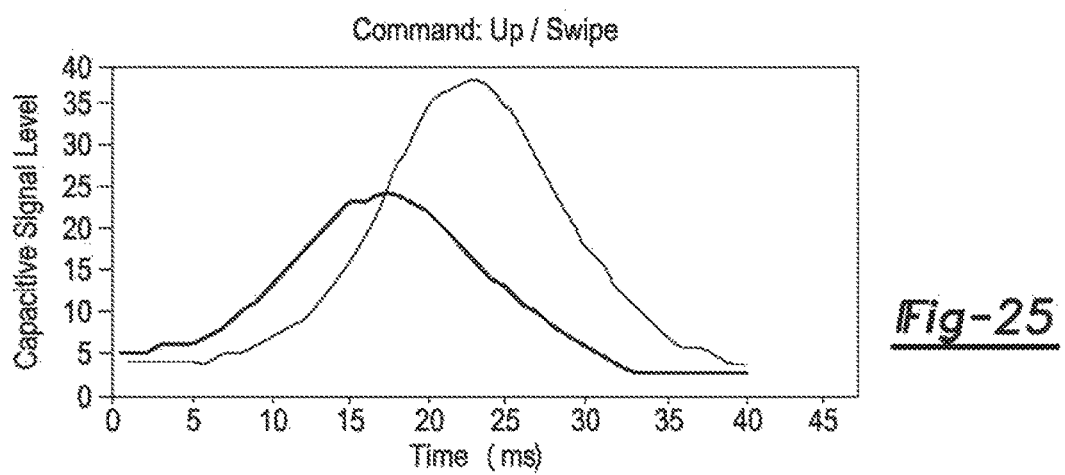
*Fig-25*
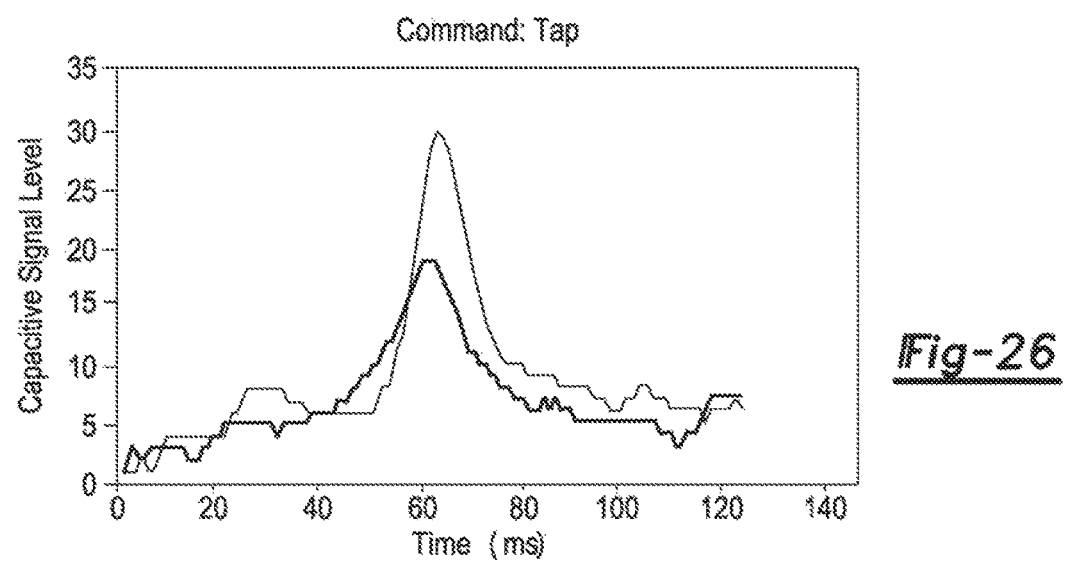
*Fig-26*

US 9,925,953 B2

SWIPE AND TAP VERIFICATION FOR ENTRY SYSTEM

CROSS-REFERENCE TO RELATED APPLICATIONS

This application is a continuation of U.S. patent application Ser. No. 14/728,052 filed on Jun. 2, 2015 which claims the benefit of U.S. Provisional Application No. 62/012,751 filed Jun. 16, 2014. The entire disclosures of each of the above applications is incorporated herein by reference.

FIELD

The present disclosure relates generally to an entry system for motor vehicles and, more particularly, to a keyless entry system having a two-step operational functionality.

BACKGROUND

This section provides background information related to the present disclosure which is not necessarily prior art.

Many passenger vehicles and trucks are now equipped with keyless entry systems alone or in combination with a traditional mechanical-type (i.e. key) entry system. In many instances, the keyless entry system includes a portable device, such as a key fob, having pushbuttons that can be manipulated to unlock/lock the vehicle doors as well as perform other functions (i.e. selective activation of alarms, headlights and/or the ignition system) through encoded RF signals transmitted to a vehicle-installed receiver. Typically, the signals supplied to the receiver are primarily used to control the selective locking and unlocking of a power-operated door latch mechanism.

Certain vehicles may be equipped with a vehicle-mounted keyless entry system. Typically, a touch device, such as a keypad, is mounted to the vehicle in close proximity to the door handle (i.e. on the door or the B-pillar) which enables an authorized user to enter a passcode consisting of a sequence of alpha or numerical codes. Upon verification of the passcode, an on-board controller unit controls operation of the power-operated door latch mechanism. The keypad may also be used to control other vehicle operational functions such as, for example, power release of the gas tank cover or the tailgate lift system following entry and verification of the correct passcode. Some keypads use pushbuttons and/or switches to enter the authentication code. One example of a touchless keyless entry keypad associated with a vehicle entry system is disclosed in U.S. Pat. No. 8,400,265 the entire disclosure of which is herein incorporated by reference. As disclosed in the '265 patent, a plurality of proximity sensors, such as capacitive sensors, are used to as the code input interfaces associated with the keypad.

Still other vehicles may be equipped with a passive keyless entry (PKE) system which utilizes a transmitter carried by the user to provide a signal to the vehicle-mounted receiver for controlling activation of the power-operated door latch mechanism with some limited tactile input from the user. Typically, close proximity of the transmitter to the vehicle and a single action, such as touching the door handle or waving in proximity to a motion detector, act to control the locking and unlocking function of the vehicle door.

While such keyless entry systems have found widespread applications in vehicle door systems (i.e. passenger doors, tailgates and closure doors), a need exists to continually advance the art and address known deficiencies associated with conventional keyless entry systems. For example, a need exists to provide additional authentication protocol to improve security and limit unintended access to the vehicle's passenger and/or storage compartments. Another need to be addressed includes limiting electrical power usage associated with "false activation" of the keypad caused by inadvertent inputs to the keypad. Such inadvertent inputs can, for example, be caused by rain, flying debris or carwash spray jets contacting the capacitive sensors associated with the keypad. As a byproduct of solving such deficiencies, inadvertent operation of the door latch mechanism will be prevented to maintain the door in its proper locked or unlocked state.

A need therefore exists for an improved method and system of keyless entry of passenger entry doors and closure members in motor vehicles and other devices. Accordingly, a solution that addresses, at least in part, the above-noted shortcomings and advances the art is desired.

SUMMARY

This section provides a general summary of the present disclosure and is not intended to be interpreted as a comprehensive disclosure of its full scope or all of its features, aspects and objectives.

Accordingly, it is an aspect of the present disclosure to provide a first user-input interface in conjunction with a second user-input interface to shift a component required to actuate a functional operation of a motor vehicle from an "inactive" mode into an "active" mode. The first user-input interface is configured to sense a force-based first user input while the second user-input interface is configured to sense a non-force based second user input. A controller is configured to receive the first and second user inputs and control shifting of the component from its inactive mode into its active mode in response to receipt of the first and second user inputs within a predetermined time period.

It is another aspect of the present disclosure that the first and second user-input interfaces be associated with an exterior surface of the motor vehicle.

It is another aspect of the present disclosure that the first user-input interface and the second user-input interface are associated with a touch device such as, for example, a keypad accessible from outside of the motor vehicle. The first user-input interface being defined by a mechanical switch and the second user-input interface being defined by at least one capacitive touch device.

According to a further aspect of the present disclosure, the controller is configured to shift the component from its inactive mode into its active mode in response to the first user input being received after receipt of the second user input and within the predetermined time period.

According to an optional aspect of the present disclosure, the controller is configured to shift the component from its inactive mode into its active mode in response to the first user input being received prior to receipt of the second user input and within the predetermined time period to define a "wake-up" functionality.

Accordingly, it is an aspect of the present disclosure to provide a first user-input interface in conjunction with at least one second user-input interface to establish an "active" mode for a keyless entry system of the type well-suited for motor vehicle applications. The first user-input interface is configured to sense a force-based first user input applied to a mode device for the purpose of shifting the keyless entry system from a low-power "inactive" mode into the active mode. The second user-input interface is configured to sense a non-force based second user input and preferably includes a proximity device, such as a capacitive sensor or other suitable touch device. A controller is also associated with the keyless entry system which receives the first and second user inputs from the first and second user-input interfaces and controls a vehicular operation in response to receipt of the first and second user inputs within a predetermined time period.

It is another aspect of the present disclosure to configure the mode device as a mechanical switch in association with a vehicle-mounted keypad of the keyless entry system. The keypad may also include a plurality of capacitive input sensors providing means for inputting the second user inputs.

It is another aspect of the present disclosure to provide the mode device in association with a passive keyless entry system.

It is another aspect of the present disclosure to provide a keypad assembly for a keyless entry system equipped with a touch switch having "swipe and tap" functionality.

It is a related aspect to provide such a swipe and tap touch switch in conjunction with a passive entry-passive start (PEPS) keyless entry system.

The swipe and tap touch switch is normally maintained in a low quiescent current or "stand by" state until a swipe dependent user-input interface detects a vertically directed user input (i.e. an upward swipe motion) applied to an activation or 'Wake-Up' touch switch. Upon detection of this swiped user input, the touch switch is shifted into a high quiescent current or 'Run' state permitting operation of a second user input such as, for example, a tap dependent input for controlling lock/unlock functionality.

These and other aspects and areas of applicability will become apparent from the description provided herein. The description and specific examples in this summary are intended for purpose of illustration only and are not intended to limit the scope of the present disclosure.

DRAWINGS

The drawings described herein are for illustrative purposes only of selected embodiments and not all implementations, and are not intended to limit the present disclosure to only that actually shown. With this in mind, various features and advantages of example embodiments of the present disclosure will become apparent from the following written description when considered in combination with the appended drawings, in which.

Figure 14:
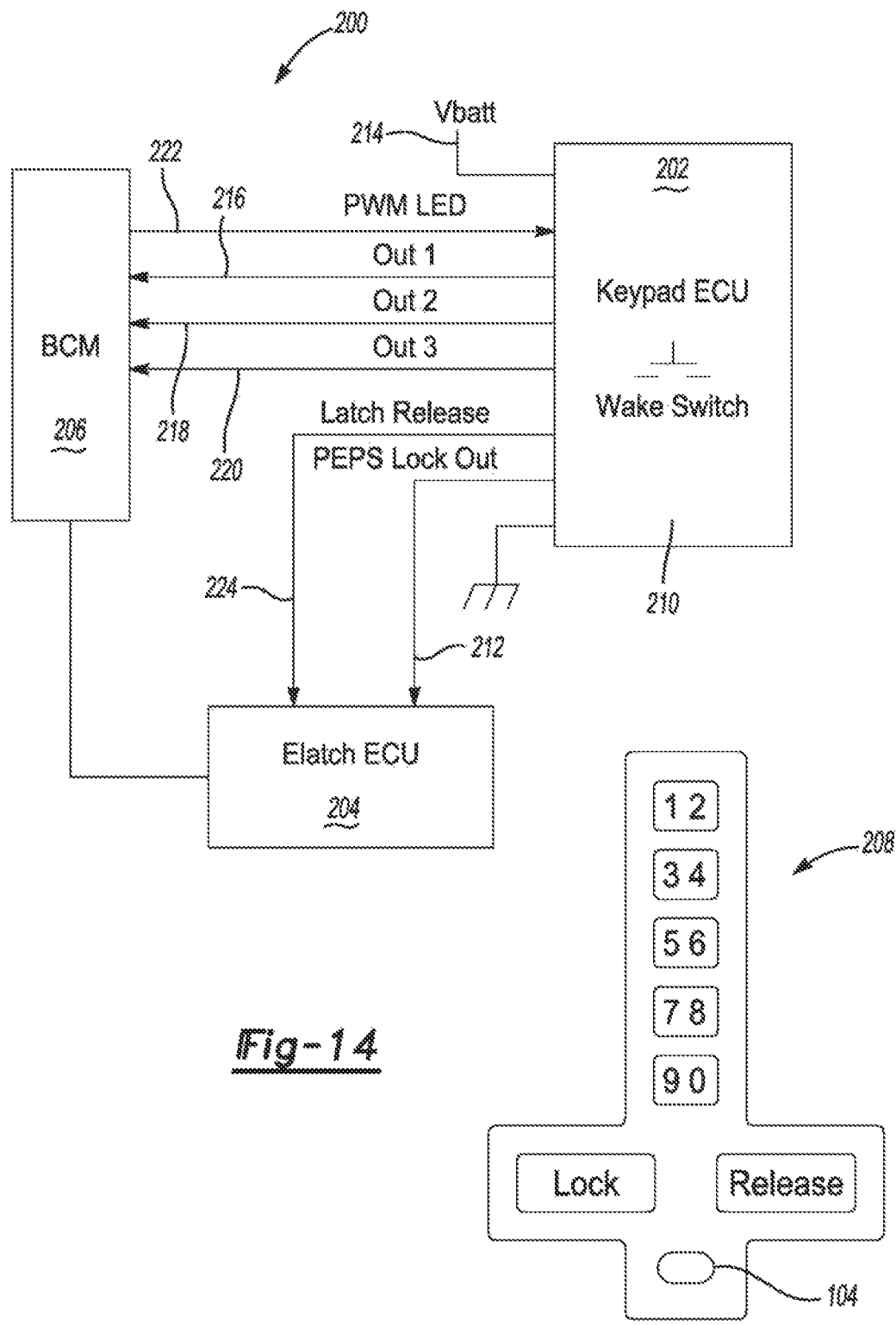
Figure 18:
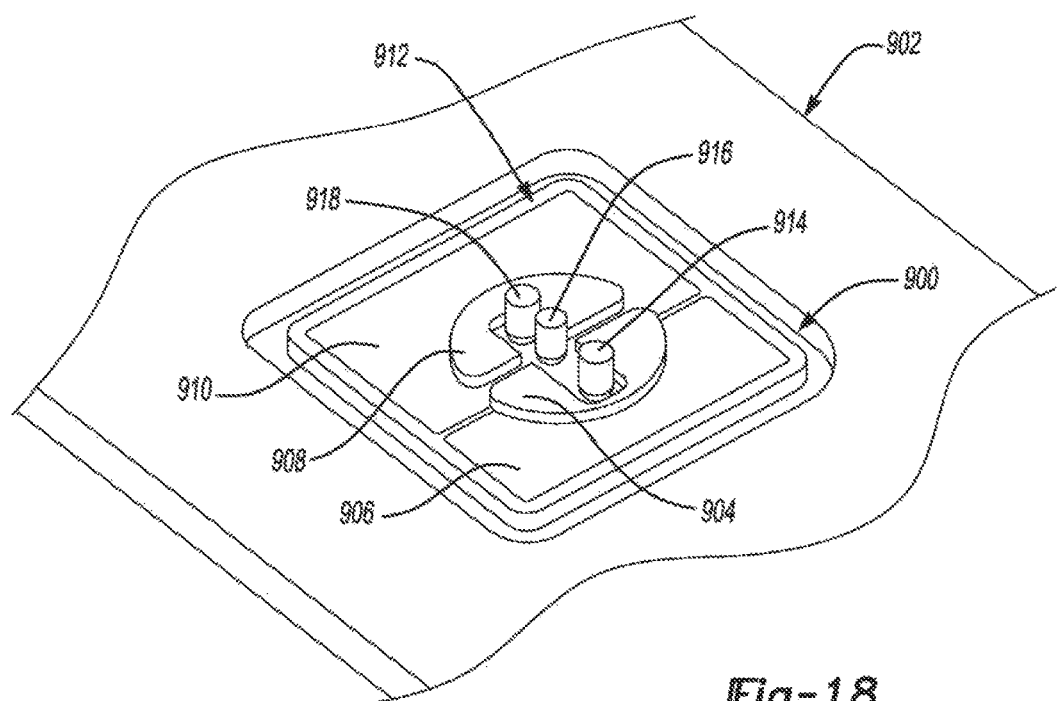
Figure 19:
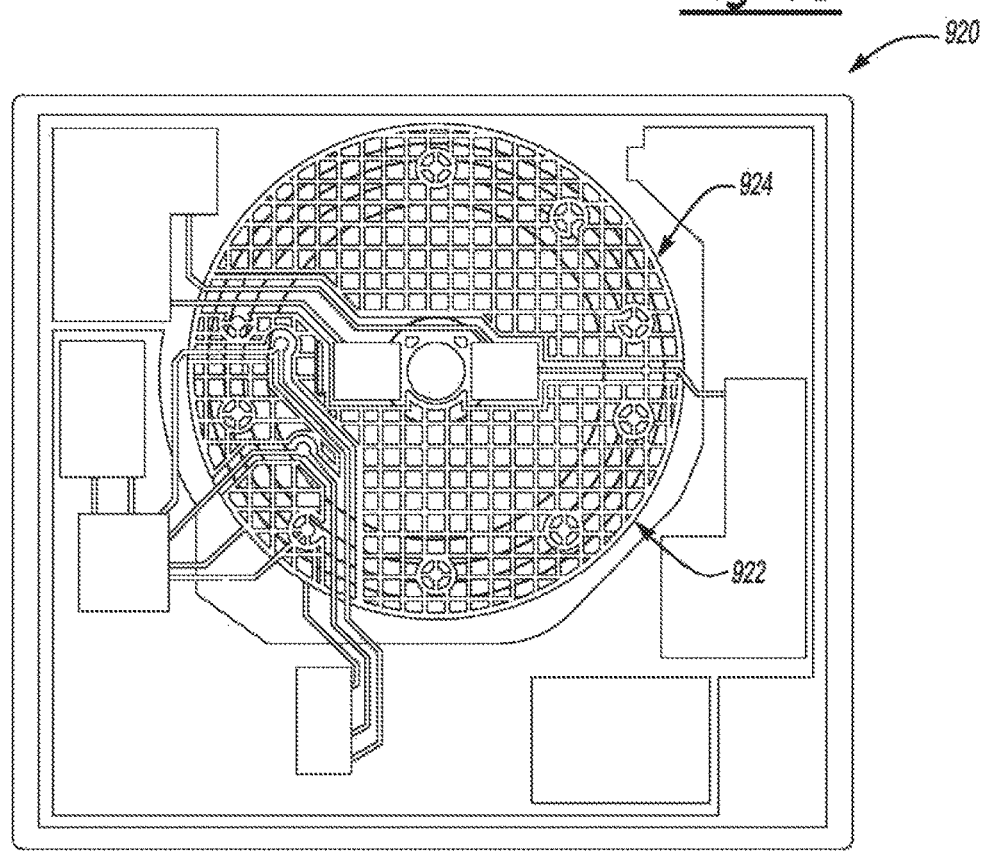
Figure 20:
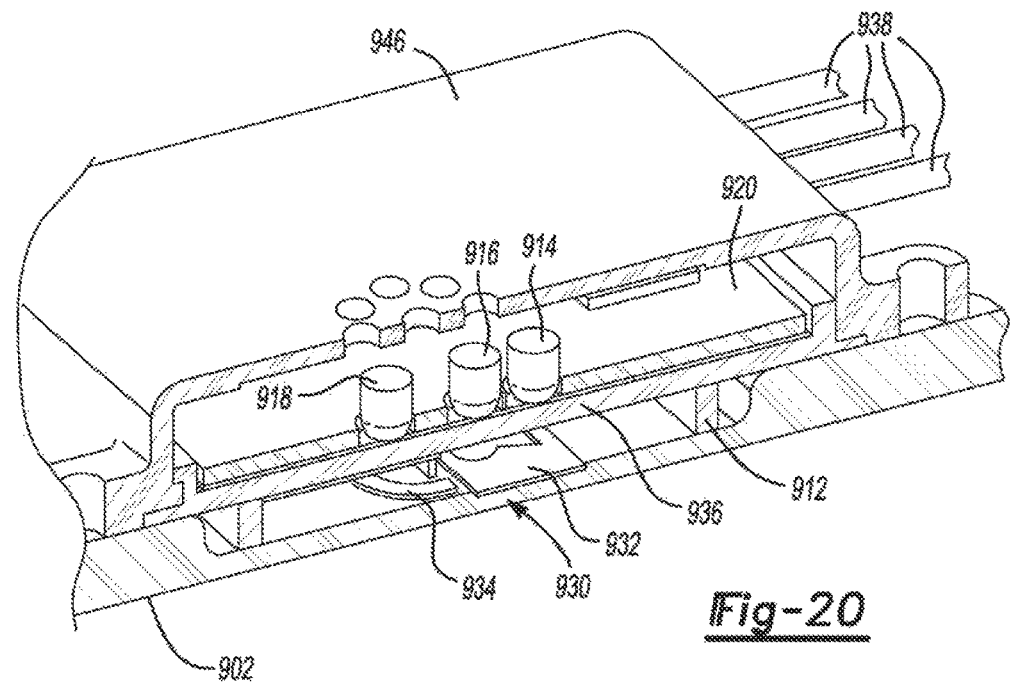
Figure 21:
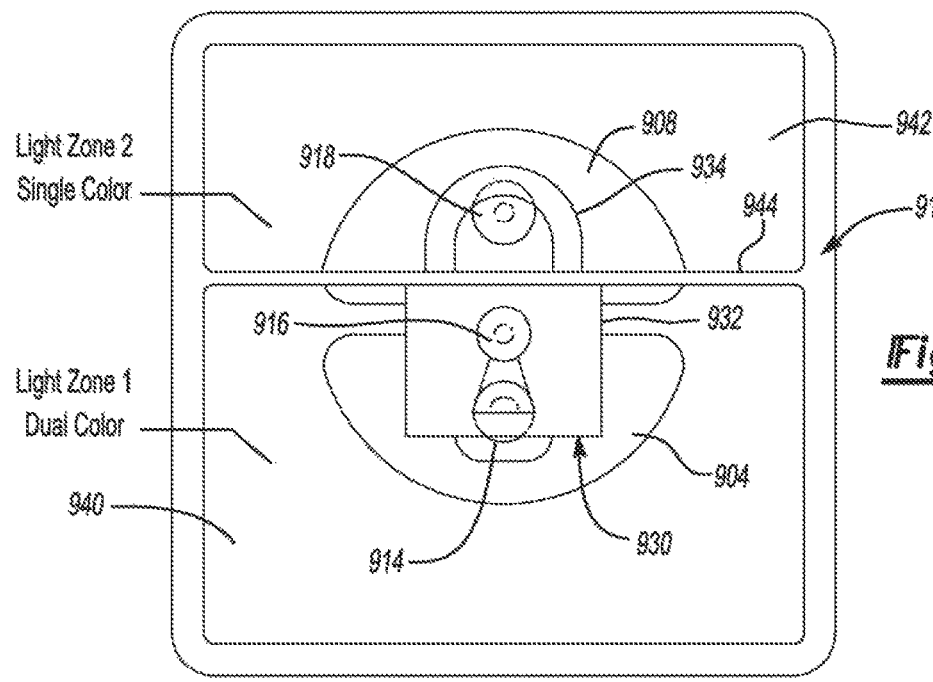
Figure 22:
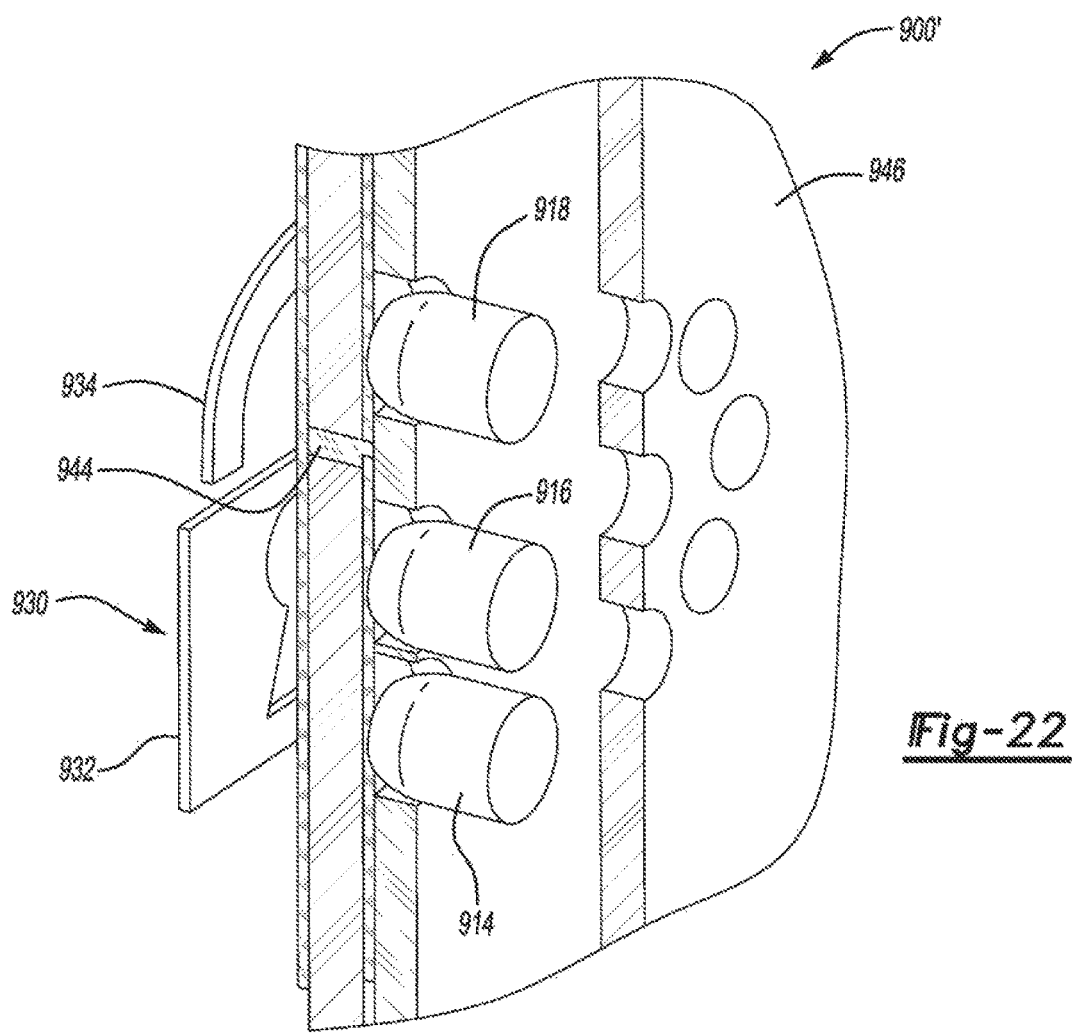
Figure 23:
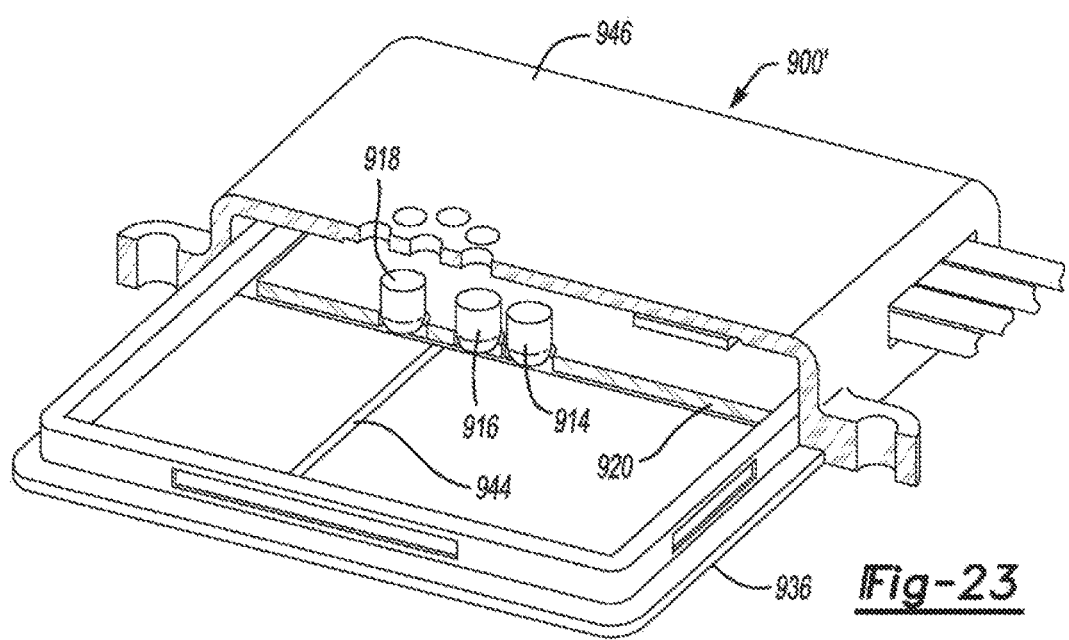
Figure 27:
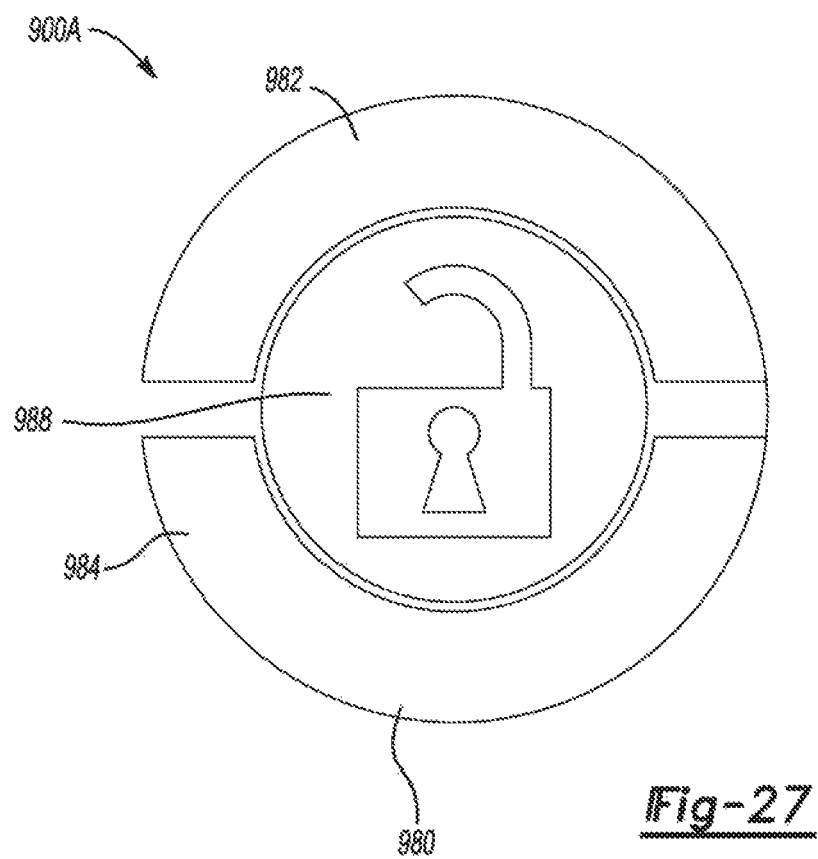

FIG. 7 lists the plurality of available output codes associated with activation of each capacitive sensing device associated with the capacitive touch pad PCB;

FIG. 8 illustrates the configuration of a keypad touch plate for the keypad assembly of the present disclosure and which is adapted for use with a driver-side front door of the motor vehicle;

FIGS. 9A and 9B illustrate configurations for a keypad touch plate for a keypad assembly adapted for use with the rear doors and the passenger-side front door;

FIG. 10 is a photograph of the keypad assembly installed within a cover plate assembly adapted to be mounted to a B-pillar of the motor vehicle;

FIG. 11 is an illustration of the keypad assembly of FIG. 10 with a cover portion of the cover plate assembly removed for improved clarity;

FIGS. 12 and 13 are additional views of the keypad assembly mounted in the applique of the cover plate assembly;

FIG. 14 illustrates a circuit for implementing a method of controlling operation of the keyless entry system of the present disclosure;

FIG. 15 illustrates an example configuration of a keypad touch plate for a keypad assembly of the present disclosure which is adapted for use with a driver-side front door of a motor vehicle and includes a swipe and tap touch switch;

FIG. 16 illustrates a configuration for a keypad touch plate for a keypad assembly adapted for use with the rear doors and the passenger-side front door and which is equipped with the swipe and tap touch switch;

FIG. 17 illustrates a logic circuit diagram for the swipe and tap touch switch of FIGS. 15 and 16;

FIG. 18 illustrates a swipe and tap touch switch having a dual zone capacitive input interface and a dual zone illumination configuration;

FIG. 19 illustrates a dual-zone capacitive touch switch configuration adapted for use with the swipe and tap touch switch of the present disclosure;

FIG. 20 is a partially-sectioned view of the dual-zone touch switch constructed according to the present disclosure;

FIG. 21 illustrates the dual-zone illumination pattern associated with the swipe and tap touch switch of the present disclosure;

FIG. 22 is another illustration of the dual zone illumination configuration for the swipe and tap touch switch;

FIG. 23 is yet another illustration showing a partially-sectioned view of the swipe and tap touch switch;

FIGS. 24A and 24B illustrate a front view of the dual zone swipe and tap touch switch;

FIGS. 25 and 26 provide example plots of capacitive inputs for the swipe-up and tap inputs, respectively; and FIG. 27 illustrates a dual capacitive and button tap configuration.

Corresponding reference numerals indicate corresponding parts throughout the various views of the drawings.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to keyless entry systems of the type well-suited for use in virtually all motor vehicle applications. The keyless entry system of this disclosure will be described in conjunction with one or more example embodiments. However, the specific example embodiments disclosed are merely provided to describe the inventive concepts, features, advantages and objectives will sufficient clarity to permit those skilled in this art to understand and practice the disclosure.

More specifically, the present disclosure relates to a vehicular system for providing access to a component required to activate a vehicle operation wherein the system includes a first user-input interface associated with an exterior surface of the vehicle which is configured to sense a first user input that is dependent on an applied force, a second user-input interface external to the vehicle which is configured to sense a second user input that is independent of an applied force, and a controller configured to control at least the component in accordance with the second user input received at the second user-input interface provided that the first user-input interface receives the first user input within a predetermined time before or after receipt of the second user input at the second user-input interface. One example of such a vehicular system is a keyless entry system for controlling locking and unlocking of a power-operated actuator of a door latch mechanism wherein the first user-input interface is defined by a mechanical switch and the second user-input interface is defined by a capacitive touch device. The keyless entry system may include a touch device, such as a keypad, mounted to an external surface of the vehicle and have both the first user-input interface and at least one second user-input interface associated with the keypad. The keyless entry system should be understood to also contemplate power release functionality of lift gates and any other closure members capable of being locked/unlocked and/or released in association with a motor vehicle.

The present disclosure further relates to a vehicular system for providing access to a component required to activate a vehicle operation wherein the system includes a first user-input interface associated with an exterior surface of the vehicle which is configured to sense a first user input, a second user-input interface external to the vehicle and configured to sense a second user input, and a controller configured to control the component in accordance with the second user input being received at the second user-input interface within a predetermined time before or after receipt of the first user input being received at the first user-input interface. The first user-input interface is a touch switch operable to detect an upwardly directed "swipe" user input operable for shifting the switch from a low-power "Stand-By" mode into a high-power operational or 'Run' mode. The second user input may, for example, be a tap-type input applied to the switch, or a separate button or second switch, which is operable to control lock and unlock functions of a power-operated actuator of a door latch mechanism associated with a keyless entry system.

Figure 1:
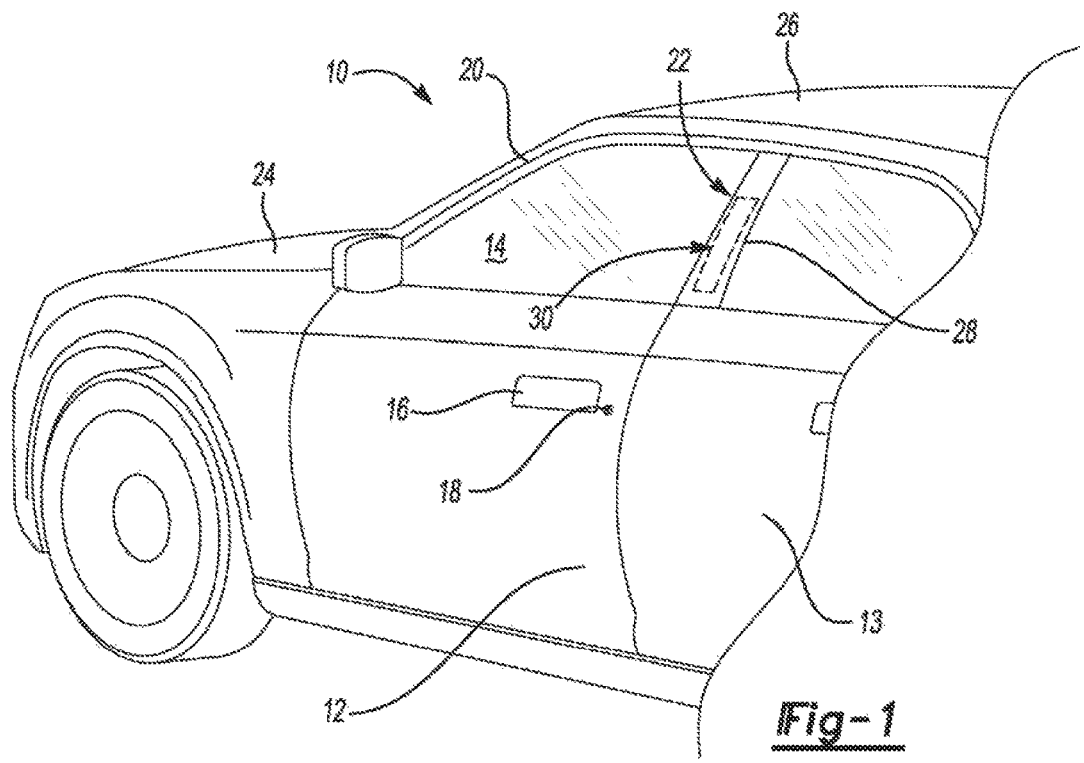
FIG. 1 is a perspective side view of a motor vehicle equipped with a keyless entry system.

Referring initially to FIG. 1, a side view of a motor vehicle 10 is shown partially cut away to include a front driver-side door 12 and a rear driver-side door 13 which both provide access to a passenger compartment 14. Front door 12 is shown to include a door handle 16 and a key hole 18 provided for otherwise conventional locking and unlocking of a mechanically-activated latch mechanism (not shown) mounted within front door 12. Movement of door handle 16 functions to release door 12 for movement relative to body portion 24 when the latch mechanism is unlocked. A similar door handle (not shown) would be provided on rear door 13 and interconnected to another latch mechanism (not shown) provided for locking and unlocking rear door 13. As will be detailed, each of the latch mechanisms may also include a power-operated actuator for controlling the locking and unlocking functions in association with a keyless entry system. Motor vehicle 10 is shown to also include an A-pillar 20, a B-pillar 22 and a roof portion 26.

In the example shown in FIG. 1, B-pillar 22 is covered by a cover plate assembly 28. A keypad assembly 30 associated with the keyless entry system of the present disclosure is mounted to B-pillar 22 within cover plate assembly 28 at the location identified by the dashed lines. Keypad assembly 30 is mounted between a structural portion of B-pillar 22 and cover plate assembly 28. As an alternative, keypad assembly 30 could be mounted to front door 12 in proximity to handle 16.

Figure 2:
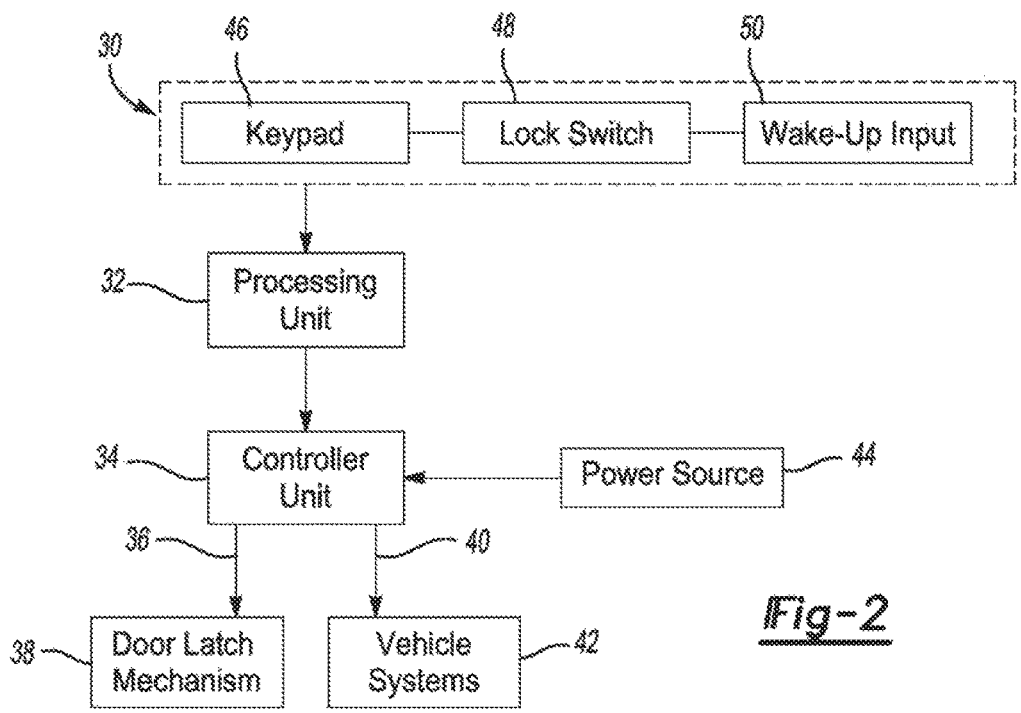
FIG. 2 is a block diagram generally depicting the various components of the keyless entry system.

Referring now to FIG. 2, a block diagram of various components of the keyless entry system is provided. As seen, keypad assembly 30 includes or is connected to a processing unit 32 which, in turn, communicates with a controller unit 34. Controller 34 provides an electrical output along line 36 to a power-operated actuator of a door latch mechanism 38. As is known, controller unit 34 may also provide electrical outputs along lines 40 for controlling other vehicular systems 42 (i.e. power release of a trunk or liftgate, actuation of the lights and/or security functions, and activation of the ignition system and/or the vehicle's heating system, etc.). A power source, such as a battery 44, may provide power to processing unit 32. As will be detailed, keypad assembly 30 includes a capacitive touch keypad unit 46, a capacitive touch lock switch 48 and a force-dependent mode input device 50.

The operation of the keyless entry system of FIG. 2 is configured to permit selective access to passenger compartment 14 via front door 12 or, in the alternative, both doors 12, 13 when the operator (hereinafter, the "user") enters an authorization code via keypad unit 46. The authentication code entered is transmitted to processing unit 32 where it is compared to a correct or verification code stored in memory. If the entered passcode matches the verification code, a signal is sent to controller unit 34 which, in turn, will unlock latch mechanism 38 and permit operation of door handle 16 to release front door 12 (or both doors 12, 13) and allow access to passenger compartment 14. Those skilled in the art will recognize that this rudimentary control diagram is merely an example of only one suitable arrangement for the keyless entry system.

Figure 5:
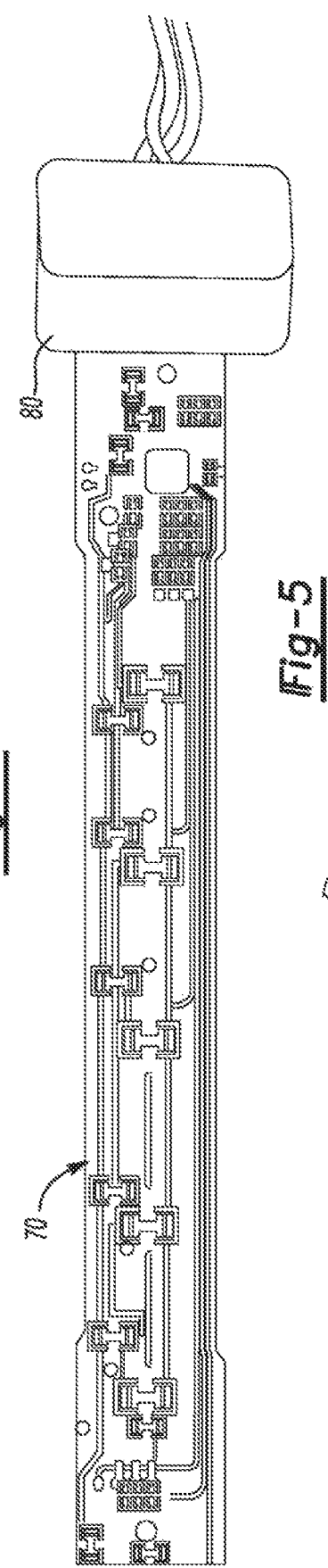
FIG. 5 illustrates a rear view of the capacitive touch pad PCB shown in FIG. 4.
Figure 6:
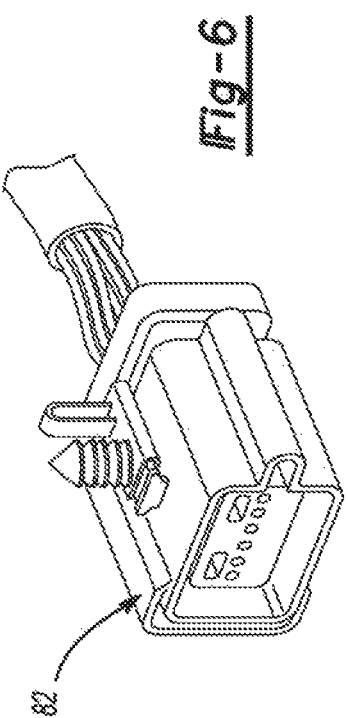
FIG. 6 illustrates the connector harness used for connecting the keypad assembly to an electronic controller unit.

Referring now to FIGS. 3 through 8, keypad assembly 30 is shown with keypad unit 46 configured to define a user-input touch interface adapted to sense user inputs based on a characteristic that is independent of force. Keypad unit 46 has a touch pad 60, a capacitive touch pad PCB 62, and a wiring harness 64. Touch pad 60 includes five (5) touch user-input interfaces or nodes, best shown in FIG. 8 to include a first (1-2) touch node 60A, a second (3-4) touch node 60B, a third (5-6) touch node 60C, a fourth (7-8) touch node 60D, and a fifth (9-0) touch node 60E. A visual indicator 66 is also associated with touch pad 60. Touch pad 60 is secured to capacitive touch pad PCB 62 which includes a first side 68 (FIG. 4) and a second side 70 (FIG. 5). First side 68, referred to as the user finger touch side, includes six (6) high brightness LED's. Five LED's, identified by reference numerals 72A-72E, correspond and function to illuminate a corresponding one of the five touch nodes 60A-60E while the sixth LED 74 provides illumination to visual indicator 66. The second side 70 of touch pad PCB includes a keypad microcontroller 75 interactive with five (5) capacitive input devices 76A-76E, each corresponding to one of touch nodes 60A-60E on touch pad 60. Wiring harness 64 includes an output connector 80 electrically connected to capacitive touch pad PCB 62, an input connector 82 adapted to be electrically connected to the controller unit, hereinafter referred to as a body control module (BCM) 84, and a multi-wire assembly 86.

Figure 3:
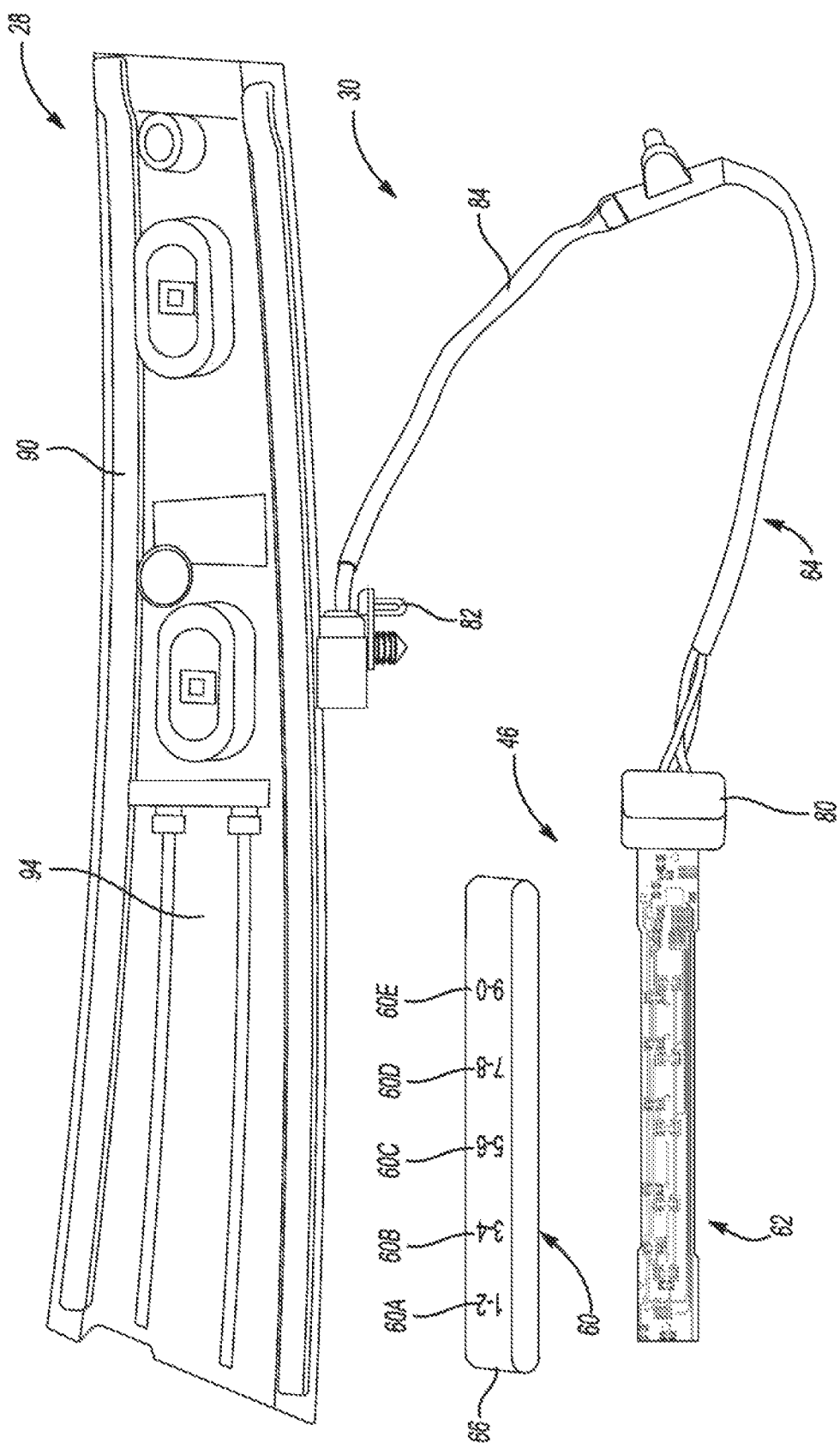
FIG. 3 is an exploded pictorial view of a keypad assembly adapted for use with the keyless entry system of the present disclosure.
Figure 4:
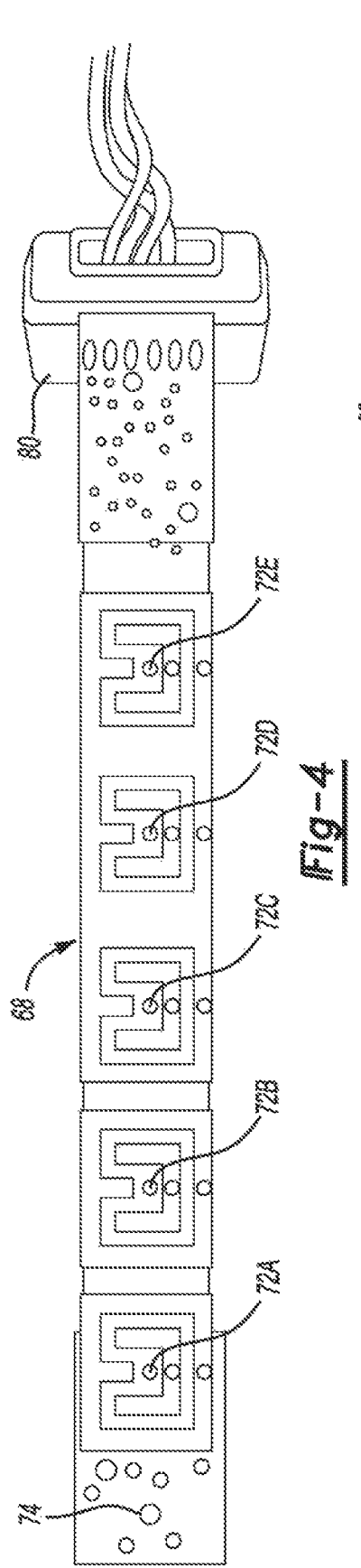
FIG. 4 illustrates a front view of a capacitive touch pad printed circuit board (PCB) associated with the keypad assembly of FIG. 3.

As seen in FIG. 3, an applique 90 associate with a cover plate assembly 28 includes a guide channel 94 configured to receive and retain touch pad 60 and capacitive touch pad PCB 62 therein. Applique 90 is adapted to be mounted to B-pillar 22 of vehicle 10. Applique 90 can be made from a tinted black or dark polycarbonate or acrylic to appear opaque in sunlight, darkness and artificial light to provide an aesthetic appearance. LED 72A-72E illuminate to permit visual indication of touch nodes 60A-60E for activation thereof by the user. Obviously, touch pad 60 can alternatively be mounted so as to be directly accessible and extend from applique 90. As noted, keypad assembly 30 could also be mounted to driver door 12 if so desired.

FIG. 7 is provided to illustrate that each touch node or user interface has an output code from BCM 84 such that a correctly entered sequence of user inputs will authenticate the pass code to permit BCM 84 to signal keypad microcontroller 75 to send an actuator signal to the power-operated activator of door latch mechanism 38.

A pair of user-input interface devices associated with lock switch 48 are shown in FIG. 8 to include a first or "LOCK" touch node 100 and a second or "RELEASE" touch node 102. Preferably, nodes 100 and 102 are capacitive type sensing devices similar in function to touch nodes 60A-60E on touch pad PCB 62. In addition, a user input device associated with mode input device 50 is shown to include a "wake-up" switch or button 104. Wake-up button 104 is a mechanical switch providing a user-input interface that is configured to sense a user input based on a force or pressure value applied thereto. As such, a distinct type of activation input is associated with wake-up button 104 than is required for capacitive keypad unit 46 and capacitive lock switch 48. In operation, after the correct combination of user-input interface options 60A-60E are asserted, the Lock/Release user inputs associated with functions 100 and 102 become available. As will be detailed further, wake-up button 104 defines a "first" or force-based user-input interface while keypad touch device 46 defines a "second" or non-force based user-input interface. Activation of force-based wake-up button 104 either before or after activation of the non-force based touch device 46, within a predetermined amount of time, will function to authenticate the inputted passcode and permit the required activation of latching mechanism 38 via Lock/Release functions 100, 102. Those skilled in the art will appreciate that the Lock/Release functionality provided by lock switch 48 can be eliminated if desired such that the Release function may occur automatically upon correct entry of the passcode sequence while the Lock function may occur upon pressing touch nodes 60D and 60E simultaneously.

FIGS. 9A and 9B illustrate touch pad configurations for a keypad unit 110 adapted for use with rear passenger doors 13 of vehicle 10 and/or the front passenger-side door of vehicle 10. As seen, keypad unit 110 is similar to keypad unit 46 except that the non-force based user-input interfaces (i.e. touch nodes 60A-60E) have been eliminated. Wake-up switch 104' is still a force-based switch to provide an intentional user-input interface that is required to shift keypad unit 110 from its inactive mode into its active mode of operation. Lock function 100 and release function 102 are similar to those described previously. As an alternative to the non-force based user inputs associated with touch nodes 60A-60E and Lock/Release functions 100, 102, the capacitive touch input devices may be substituted with other proximity-type sensing technologies. In any arrangement, keypad units 46, 110 must be shifted into its active mode via activation of wake-up switch 104, 104' prior to BCM 84 signaling keypad microcontroller 25 to authenticate the inputted passcode sequence and activate door latch 38.

Referring now to FIGS. 10 through 13, a B-pillar keypad assembly 120 is shown to include cover plate unit 92 having applique 90 mounted to a cover plate 122. FIG. 10 illustrates the location of Lock node 100, Release node 102, and wake-up switch 104, while the capacitive user-input interfaces on keypad assembly 30 are not illuminated. Lock switch 48 is also mounted to cover plate 122 and integrates the Lock/Release capacitive type user-input interfaces 100, 102 in a common unit with the force-based user-input interface of wake-up switch 104. Obviously, the arrangement can be reconfigured in many alternative arrangements such as incorporating touch nodes 60A-60E and Lock/Release touch nodes 100, 102 into a common keypad and microcontroller assembly while maintaining wake-up switch as a separate device. Regardless of the arrangement, the keyless entry system of the present disclosure has a first user-input interface for providing an actuation or "wake-up" function and one or more second user-input interfaces for providing the authentication function prior to activation of the door lock.

Referring to a circuit diagram shown in FIG. 14, a circuit 200 is provided for implementing the systems and methods of the present disclosure and includes a keypad ECU 202, an electrically-activated latch ECU (Elatch ECU) 204, and a body control module (BCM) 206. Circuit 200 is configured to be implemented along with a touch device 208 that is identical in function to that keypad unit 46 previously described. Wake switch 210 is shown included in keypad ECU 202. Wake switch 210 may be implemented with any circuit element that provides a switching capability such as, for example, a transistor. Wake switch 210 is initiated when the user asserts wake-up button 104 shown herein as a push button on the keypad. Once wake switch 210 has been closed, an indication via a passive entry/passive start (PEPS) lock out wire 212 is transmitted to Elatch ECU 204. While FIG. 14 shows connections with wires, those skilled will appreciate that wireless connections are also possible and contemplated.

Keypad ECU 202 may be supplied with power via a battery (Vbatt) 214 after wake switch 210 has been closed. If wake switch 210 is closed, the passcode entered via touch input device 208 may be transmitted to BCM 206 via Out wires 216, 218, 220. Thereafter, BCM 206 transmits an indication that the enter code is verified and authenticated via LED line 222. Accordingly, a command signed transmitted via a latch release line 224 is delivered to Elatch ECU 204 instructing it to perform an operation such as, for example, releasing the door latch mechanism. Once the door is thereafter opened or subsequently closed, wake switch 210 is opened.

While the terms "wake" and "wake-up" have been used to describe force-based switches 104, 104' and 210, it will be understood that this nomenclature is only used to describe the function of these switches to shift the keyless entry system into an active mode. As has been clearly stated, assertion of the first force-based user-input interface can occur either before or after assertion of the second capacitive-based user-input interface(s) to shift the keyless entry system from an inactive mode into an active mode, contingent on receipt by the controller of both of the first and second user inputs within a predetermined time period. One non-limiting example of a predetermined time period for input of both user input is in the range of 5-15 seconds.

In addition, the terms "inactive/stand-by" and "active/run" are intended to describe the status of the controller to actuate the vehicle component such as, for example, the power door latch mechanism. In the inactive mode, the keypad is still operable to receive the capacitive second user input(s) to provide passcode verification. However, assertion of the force-based first user input is required to confirm the verification process and allow the controller to send an actuation system to the vehicle component. Thus, a two-step authentication process is provided.

The present disclosure is also directed to keypad assemblies for use in keyless entry systems (i.e. passive entry and/or passive start) having a touch switch with "swipe and tap" functionality. An upwardly directed swipe motion applied to or in close proximity with the touch switch functions to shift the switch from a "stand-by" or low current state to a "run" or high current state. The upward swipe is provided to eliminate or significantly limit occurrences of false activation of the touch switch caused by rain. In this regard, the touch switch also includes a dual zone illumination image configuration and capacitive switch arrangement, with the image displayed on an applique of the vehicle. The image displayed indicates, for example, the state of the door latch mechanism (i.e. locked or unlocked) when the user approaches the vehicle. One part of the image is displayed in a certain color when the door is unlocked. In contrast, both parts will be displayed in different colors when the door is locked.

The capacitive touch switch is required to make full contact (i.e. no air gaps) with the applique, which can limit the packaging available for a two part/two color image display. As is known, there are problems with false activations of capacitive switches in externally-mounted keypads/appliques in automotive applications due to water contact. During a rainstorm or car wash, the water can contact the user-input interface and cause electrical activation of the capacitive switch. This, in turn, can cause the system to switch from a low power state to a high power state (i.e. LED display with 20 milliamp current draw). Such unintentional current draw is undesirable. Accordingly, a switch housing or applique is provided which separates the two parts of the image into different zones so that each zone can be lit independently without light bleeding through to the other zone. To accomplish this, an opaque barrier, provided in either the switch housing or the applique, creates two distinct zones with each zone capable of transmitting light through an image without light contamination to the other zone. The use of double-sided adhesive tape to bond the printed circuit board (PCB) to the switch housing and to bond the switch housing to the applique eliminates air gaps.

In one configuration, LED's are mounted into holes in the PCB to create the necessary light required to display the image. Preferably, two (2) LED's are used to light two different color image portions of the image (i.e. the lower half) while a single LED lights the upper half of the image. An example image can be a lock icon.

The logic utilized to eliminate false water activations includes the operator inputting a "swipe-up" motion to activate two separate capacitive contact zones or pads in sequence. The controller unit recognizes this sequential capacitive input and switches the system from a low power state into a high power state. The system has three (3) stages of operation including a stand-by stage, a wake-up stage, and a full-run stage. Accordingly, a two capacitive sensor/pad configuration oriented vertically provides means for shifting from the low power stand-by mode into the wake-up mode. A low frequency scan is used in the low quiescent current stand-by state. It acts as a waiting mode for user to wake-up the touch switch and enter the command (swipe-up). The Run state is transitioned when the wake-up state is detected. In this state, quiescent current is not a concern and capacitive sensors are run at high scan frequency. Preferably, in order to positively identify a LOCK command in the Run state—both sensing elements (i.e. the upper and lower capacitive inputs) need to be triggered.

Referring to FIG. 15, an example configured of a keypad plate 600 for a keypad assembly 46' is shown which is generally similar to keypad plate 60 of FIG. 8 with the exception that capacitive input-interfaces 100, 102 for the LOCK/UNLOCK functions has been replaced with a swipe and tap (S/T) touch switch 602. Similarly, keypad plate 700 of FIG. 16 is generally similar to keypad plate 110 of FIG. 9A except that the LOCK/UNLOCK function switches 100, 102 have again been replaced with a S/T touch switch 702. Generally speaking, touch switch 602, 702 is configured to include a first or lower capacitive input interface and a second or upper capacitive input interface aligned vertically and operatively arranged to detect an upwardly directed or "swipe-up" sequential input. Upon detection of the swipe-up input, the controller (as previously disclosed) shifts the keyless entry system from a switch "stand-by" state to a switch "wake-up" state. In the wake-up state, a "tap" input to one or both capacitive input interfaces (as required to meet lock/unlock control) provides a switch "run" state wherein one of the functional operations of the LOCK or UNLOCK modes is available.

FIG. 17 illustrates an example logic circuit 800 for touch switches 602, 702 for a passive entry/passive start (PEPS) entry system. Specifically, block 802 indicates the T/S touch switch is operational in its low power (i.e. lower quiescent current) condition. A low frequency scan of the status of switch 602, 702 is performed. A decision block 804 determines whether a swipe-up input has been detected. If not, switch 602, 702 is maintained in its stand-by mode. If yes, switch 602, 702 is shifted into a wake-up state. Thereafter, a tap inputted to switch 602, 702 shifts it into its Run state, as shown, at block 806, and allows the subsequent tap input to perform either of a desired (i.e. Lock or an Unlock) function. A high frequency scan is performed in the Run state and switch 602, 702 is now functioning in a high power (i.e. high quiescent currant) condition. Line 808 indicates that the tap input into touch switch 602, 702 must be completed within a predetermined time period to authenticate the input. If the tap input is not authenticated after expiration of the time period, switch 602, 702 returns to its stand-by state.

Referring now to FIGS. 18-21, a T/S touch switch 900 adapted for use with either lock switch 602 of FIG. 16 and lock switch 702 of FIG. 16 will now be described in greater detail. Touch switch 900 is preferably molded/inserted into an applique 902 adapted to be mounted to an external surface of the recess. Touch switch 900 includes a first capacitive switch pad 904 associated with a first or lower portion 906 of an applique recess and a second capacitive switch pad 908 associated with a second or upper portion 910 of the applique recess. An opaque barrier 912 delineates lower portion 906 from upper portion 910 to create a dual light zone. Upon assembly, second capacitive switch pad 908 is configured to be vertically aligned above first capacitive switch pad 904. As also shown, a pair of LED's 914, 916 are aligned with first capacitive switch pad 904 while a single LED 918 is associated with second capacitive switch pad 908.

FIG. 19 illustrates a two-zone capacitive switch design associated with PCB 920 of touch switch 900. PCB 920 illustrates circuitry for a lower zone 922 controlling operation of the first capacitive touch pad 904 and an upper zone 924 associated with second capacitive touch pad 908. The arrow 926 illustrates the directional input required to sequentially activate first touch pad 904 and second touch pad 908 to shift touch switch 900 from its stand-by mode into its wake-up mode.

FIG. 20 illustrates a partially-sectioned view of touch switch 900. Switch 900 includes a two-part symbol, such as a lock icon 930 having a first/lower part 932 aligned with first capacitive pad 904 and a second/upper part 934 aligned with second capacitive pad 908. Icon 930 is disposed between applique 902 and a transparent switch cover 936. Electrical leads 938 are provided to electrically interconnect switch 900 to controller unit 34. FIG. 21 illustrates the dual zone illumination configuration with a lower dual color first zone 940 and an upper single color second zone 942 delineated by a horizontal web 944 of the opaque barrier 912.

FIGS. 22, 23, 24A, and 24B illustrate a slightly modified version of touch switch 900 that is generally similar to touch switch 900' with exception that it is molded into a switch housing 946.

FIG. 25 provides an example plot of capacitive signal level vs. time for a pair of different "swipe-up" inputs to touch switch 900, 900'. Similarly, FIG. 26 provides an example plot for a pair of different "tap" inputs to touch switch 900, 900'.

FIG. 27 illustrates a touch switch 900'. Touch switch 900A is shown to include a first capacitive touch pad 980 aligned vertically below a second capacitive touch pad 982. A distinct "tap" pad 984 is disposed centrally between touch pads 980 and 982. Tap pad 984 can be a capacitive device, a mechanical switch or any other suitable device capable of inputting a desired functional command following sequential activation of pads 980, 982 via the upward swipe input to switch 900A. An illuminated icon/display 988 is associated with tap pad 984. Touch switch 900A is merely one possible alternative configuration of swipe and tap switch of the present disclosure.

Those skilled in the art will also recognize that the present disclosure has applicability to keyless entry system, both passive and non-passive, for controlling actuation of additional vehicular functions. A non-limiting listing of such additional functions may include release of the gas tank cover plate, power window control, power release of vehicular doors in addition to lock/unlock functionality, and lock/unlock and power release of liftgates. It should also be recognized that the force-based user-input interface may be located remotely from the capacitive-based user-input interfaces. The force-based input is not intended to merely wake-up or actuate the non-force based input, but can also be part of a multi-stage control protocol for controlling a vehicle component. The present invention also contemplates use of second user-input interfaces for gesture recognition control systems.

It should furthermore be understood that the present disclosure is also applicable to passive keyless entry systems where the user possesses a passive entry fob such that the first force-based user-input interface would act as a "request" button that is pushed in combination (either before or after) performance of a single action such as for example, actuating a capacitive touch sensor on the door handle to lock and unlock/release the vehicle door. Once the recognized combination of request button engagement and the non-force based single action input(s) are received by the controller, and the entry fob confirms authentication for access, then the vehicle is controlled to perform the requested function.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Those skilled in the art will recognize that the inventive concept disclosed in association with an example keyless entry system can likewise be implemented into many other vehicular systems to control one or more operations and/or functions. Means of activating the second user-input interfaces (the touch interfaces on the keypad), other than touch may be employed. The alternative to capacitive sensors may include, without limitation, touch sensitive sensors, resistive sensors, temperature sensors, optical scanners, gesture sensors or any combination thereof provided that they are non-force based inputs.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

We claim:

1. A method for providing access to a component to actuate a vehicle operation, the method comprising:
   providing a user-accessible first user-input interface associated with an exterior of the vehicle for sensing a first user input based on an upwardly directed swipe motion, the first user-input interface including two separate sensors;
   providing a second user-input interface external to the vehicle for sensing a second user input, wherein the second user-input interface is associated with the first user-input interface; and
   allowing activation of the component only if the sensors of the first user-input interface receive the first user input in a predetermined sequence and the first user-input interface also receives the first user input within a predetermined time of the second user input being received at the second user-input interface.

2. The method according to claim 1, wherein the first user-input interface is defined by a capacitive touch device including the sensors.

3. The method according to claim 1, wherein the first user-input interface and the second user-input interface are associated by physical proximity of the first user-input interface and the second user-input interface external to the vehicle.

4. The method according to claim 1, wherein a controller controls the component in accordance with the second user input received at the second user-input interface provided the first user-input interface receives the first user input within the predetermined time before the second user input is received at the second user-input interface.

5. The method according to claim 1, wherein a controller controls the component in accordance with the second user input consisting of a single temporal action.

6. The method according to claim 1, wherein a controller controls a plurality of components in accordance with the second user input received at the second user-input interface provided the first user-input interface also receives the first user input within the predetermined time of the second user input.

7. The method according to claim 1, wherein the vehicle operation is at least one of moving a window, unlocking a latch associated with the vehicle's door, starting the vehicle, and automatically opening the vehicle's door.

8. The method according to claim 1, wherein the first user-input interface and the second user-input interface are provided on a keypad accessible externally of the vehicle.

9. The method according to claim 8, wherein the sensors of the first user-input interface are vertically aligned proximity type sensors, wherein the second user-input is defined by a proximity type sensor, and wherein the proximity type sensor providing the second user input can be at least one of the vertically aligned proximity type sensors of the first user-input interface.

10. The method according to claim 9 wherein the proximity type sensors of the first user-input interface are capacitive touch devices.

11. The method according to claim 1 wherein the first user-input interface comprises capacitive touch pads including the sensors.

12. The method according to claim 1 wherein the second user input is based on an applied force.

13. A method for actuating a power release of a vehicle lift gate, the method comprising:
    providing a user-accessible first user-input interface associated with an exterior of the vehicle for sensing a first user input based on an upwardly directed swipe motion, the first user-input interface including two separate sensors;
    providing a second user-input interface external to the vehicle for sensing a second user input, wherein the second user-input interface is associated with the first user-input interface; and
    allowing activation of the lift gate power release only if the sensors of the first user-input interface receive the first user input in a predetermined sequence and the first user-input interface also receives the first user input within a predetermined time of the second user input being received at the second user-input interface.

14. The method according to claim 13, wherein the first user-input interface is defined by a capacitive touch device including the sensors.

15. The method according to claim 13, wherein the first user-input interface and the second user-input interface are associated by physical proximity of the first user-input interface and the second user-input interface external to the vehicle.

16. The method according to claim 13, wherein a controller controls the component in accordance with the second user input received at the second user-input interface provided the first user-input interface receives the first user input within the predetermined time before the second user input is received at the second user-input interface.

17. The method according to claim 13, wherein a controller controls a plurality of components in accordance with the second user input received at the second user-input interface provided the first user-input interface also receives the first user input within the predetermined time of the second user input.

18. The method according to claim 13, wherein the first user-input interface and the second user-input interface are provided on a keypad accessible externally of the vehicle.

19. The method according to claim 18, wherein the sensors of the first user-input interface are vertically aligned capacitive touch devices, wherein the second user-input is defined by a capacitive touch device, and wherein the capacitive touch device providing the second user input can be at least one of the vertically aligned capacitive touch devices of the first user-input interface.

20. The method according to claim 13 wherein the first user-input interface comprises capacitive touch pads including the sensors.

21. A method for actuating a latch assembly associated with closure member of a vehicle, wherein the latch assembly is capable of being locked, unlocked and/or released, the method comprising:
providing a user-accessible first user-input interface associated with an exterior of the vehicle for sensing a first user input based on an upwardly directed swipe motion, the first user-input interface including two separate sensors;
providing a second user-input interface external to the vehicle for sensing a second user input, wherein the second user-input interface is associated with the first user-input interface; and
allowing activation of the latch assembly only if the sensors of the first user-input interface receive the first user input in a predetermined sequence and the first user-input interface also receives the first user input within a predetermined time of the second user input being received at the second user-input interface.

* * * * *